United States Patent [19]

Narabu et al.

[11] Patent Number: 4,990,862
[45] Date of Patent: Feb. 5, 1991

[54] OUTPUT STAGE FOR SOLID-STATE IMAGE PICK-UP DEVICE

[75] Inventors: Tadakuni Narabu; Yasuhito Maki; Tetsuya Kondo, all of Kanagawa, Japan

[73] Assignee: Sony Corporation, Tokyo, Japan

[21] Appl. No.: 145,292

[22] Filed: Jan. 19, 1988

Related U.S. Application Data

[63] Continuation-in-part of Ser. No. 14,544, Feb. 13, 1987, abandoned.

[30] Foreign Application Priority Data

| Feb. 24, 1986 | [JP] | Japan | 61-37333 |
| Jan. 22, 1987 | [JP] | Japan | 62-11357 |
| Jan. 22, 1987 | [JP] | Japan | 62-11356 |

[51] Int. Cl.$^5$ .................. H03F 3/45; H03F 3/16
[52] U.S. Cl. .................. 330/253; 330/260; 307/353
[58] Field of Search .......... 307/353, 497; 330/253, 330/277, 310, 311, 260

[56] References Cited

U.S. PATENT DOCUMENTS

| 3,586,880 | 6/1971 | Fitzwater | 307/353 |
| 3,781,574 | 12/1973 | White et al. | 307/353 X |
| 4,109,215 | 8/1978 | Comer et al. | 307/353 |
| 4,166,248 | 8/1979 | Bianchi et al. | 307/353 |
| 4,352,070 | 9/1982 | Beauducel et al. | 307/353 |
| 4,404,479 | 9/1983 | Toyomaki | 307/353 |
| 4,454,435 | 6/1984 | Burns | 307/353 X |
| 4,739,281 | 4/1988 | Doyle | 330/253 |

FOREIGN PATENT DOCUMENTS

| 0091819 | 4/1983 | European Pat. Off. . |
| 0107337 | 9/1983 | European Pat. Off. . |
| 0114475 | 12/1983 | European Pat. Off. . |
| 0139499 | 10/1984 | European Pat. Off. . |

Primary Examiner—Steven Mottola
Attorney, Agent, or Firm—Ronald P. Kananen

[57] ABSTRACT

An output stage of a solid-state image pick-up device, such as a CCD solid-state image pick-up device is accurately operable even under a lower source source voltage is easy to design and does not require substantial precision in production. The improved output stage construction of a solid-state image pick-up device, according to the present invention, has a buffer circuit, connected to at least one of a input side or a output side of an output stage circuit component, such as an amplifier circuit, and a low-pass filter source source. The buffer circuit is so designed as to have a constant DC level and a gain about 1.

30 Claims, 4 Drawing Sheets

SOURCE -FOLLOWER

BERTON

SOURCE
-FOLLOWER

BERTON

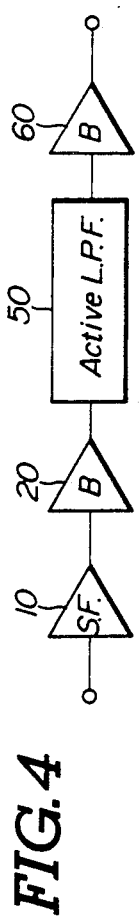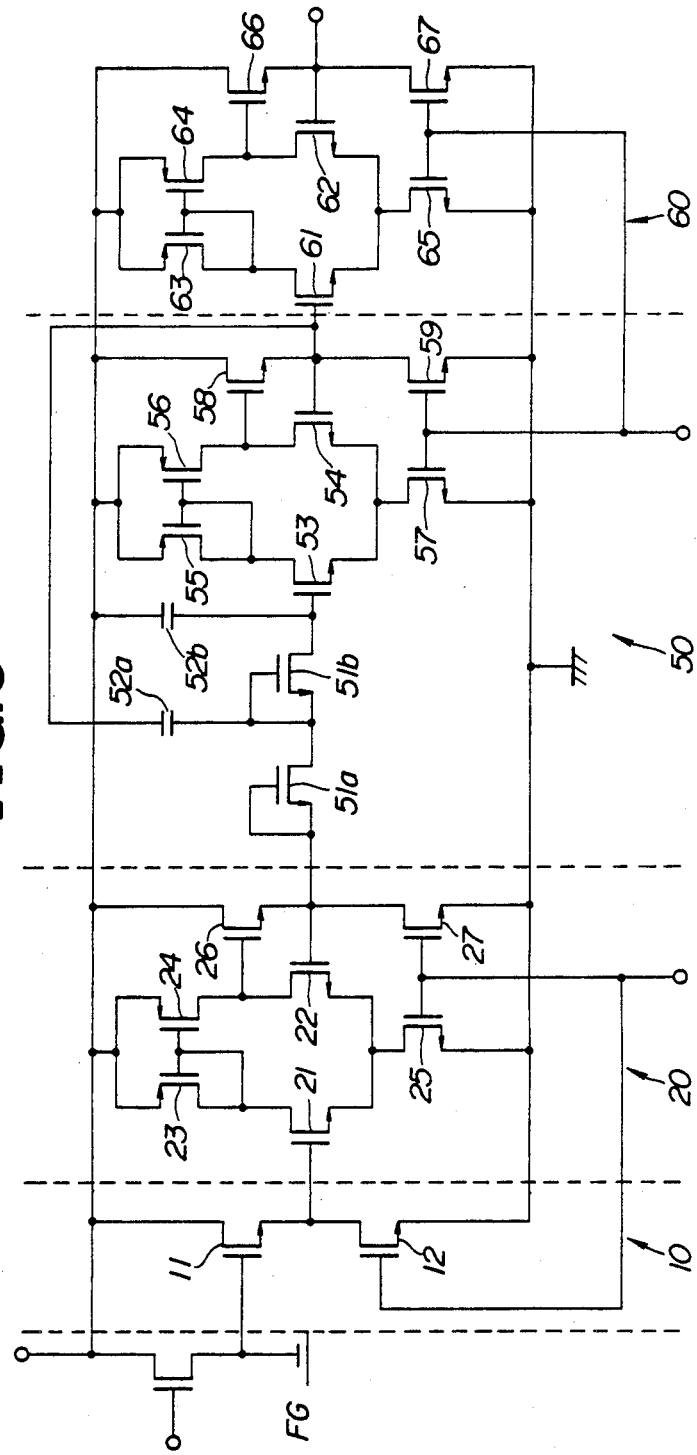
FIG.4
FIG.5

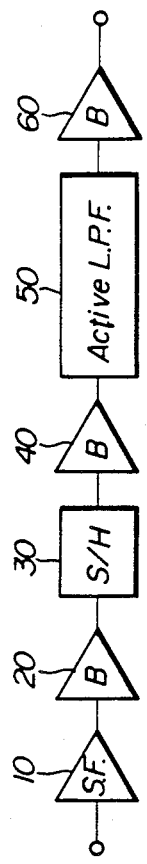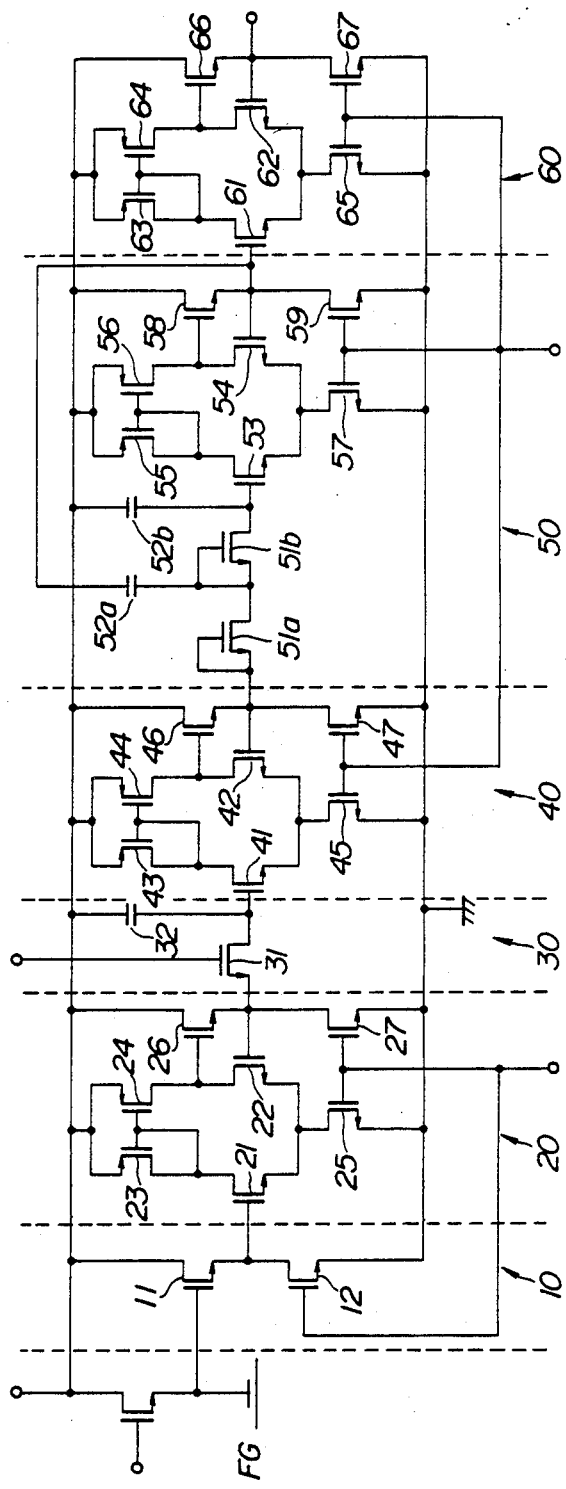

OUTPUT STAGE FOR SOLID-STATE IMAGE PICK-UP DEVICE

CROSS REFERENCE TO THE RELATED APPLICATION

This application is a Continuation-in-Part Application of the United States Patent Application Ser. No. 014,544, filed on Feb. 13, 1987, which is now abandoned in favor of this application.

BACKGROUND OF THE INVENTION

1. Field of the Invention

The present invention relates generally to an improvement in and relating to an output stage of a solid-state image pick-up device, such as a charge-coupled device (CCD). More specifically, the invention relates to an output stage for a solid-state image pick-up device which is operable even at low voltage.

2. Description of the Background Art

In the past, an image pick-up device, such as a CCD, is provided with a higher power source voltage in comparison with that in other semiconductor devices, such as a memory composed of a plurality of MOS transistors. As a typical output stage construction of the image pick-up device, an inverter circuit or a source follower circuit are employed. In the former case, the inverter circuit comprises a pair of first and second MOS transistors. The first MOS transistor has a gate to receive an input signal. The second transistor has a gate and drain connected to each other for forming an active load. An output signal is output between a drain of the first MOS transistor and the second MOS transistor.

In the inverter circuit as set forth above, the output level may not coincide with the input level. Therefore, when such an inverter circuit is combined with a low-pass filter, a sample/hold circuit and so forth, the source voltage has to be sufficiently high so as to avoid an influence by fluctuation of the output level. In addition, in such an inverter circuit, the circuit design becomes complicated which makes it difficult to design.

On the other hand, the conventional source follower circuit may comprise a pair of first and second MOS transistors. The first MOS transistor receives the input signal at its gate and outputs the output signal from its source. Such source follower circuit has a substantially small gain, e.g. less than or equal to 0 dB. Therefore, when a plurality of source followers are connected to form multi-state source follower circuit, the gain of such circuit becomes unacceptably small.

On the other hand, recently, there is a tendency to require an image pick-up device which is active at a lower power source voltage. If the image pick-up device for low power source voltage operation is designed employing the conventional inverter circuit or the source follower circuit, the level margin becomes substantially small to cause malfunction when fluctuation in the DC level occurs.

SUMMARY OF THE INVENTION

Therefore, it is an object of the present invention to provide an improved output stage for a solid-state image pick-up device, such as a CCD, which is accurately operable even under a lower source voltage.

Another object of the invention is to provide an improved output stage construction of the solid-state image pick-up device which is easy to design and does not require substantial precision in production.

In order to accomplish the aforementioned and other objects, an improved output stage construction of a solid-state image pick-up device, according to the present invention, has a buffer circuit, connected to at least one of an input side or an output side of an output stage circuit component, such as an amplifier circuit, or a low-pass filter source. The buffer circuit is so designed as to have a constant DC level and a gain about 1.

According to one aspect of the invention, an output circuit for a solid state image pick up device comprises an amplifier circuit connected to the solid-state image pick-up device for amplifying the output signal of the solid-state image pick-up device, and a buffer amplifier circuit in a voltage follower construction connected to at least one of an input side and an output side of the amplifier circuit, the buffer amplifier circuit having a gain of substantially 1 and outputting constant DC level output signal.

The output circuit may further comprise a filter circuit forming a series circuit with the amplifier which is preferably an active low pass filter. Also, the output circuit may include a sample/hold circuit.

The output circuit is provided with a pair of buffer amplifier circuits, one of which is connected to output side of the amplifier and input side of the filter circuit, and the other of which is connected to output side of the filter circuit.

According to another aspect of the invention, an output circuit for a solid-state image pick-up device comprises an amplifier circuit connected to the solid-state image pick-up device for amplifying the output signal of the solid-state image pick-up device, the amplifier circuit including a NMOS transistor having a base connected to an output of the solid-state image pick-up device, and a drain connected to a power source, the NMOS transistor being switched between a conductive state and a non-conductive state by the output signal of the solid-state image pick-up device applied to the gate for outputting an output signal from the source of the NMOS transistor, and a buffer amplifier circuit in a voltage follower construction connected to at least one of an input side and an output side of the amplifier circuit, the buffer amplifier circuit having a gain of substantially 1 and outputting constant DC level output signal, the buffer amplifier including first, second and third NMOS transistors and first and second PMOS transistors, the first NMOS transistor having a gate connected to the source of the NMOS transistor of the amplifier circuit, the first, second and third NMOS transistors and the first and second PMOS transistors cooperating with each other for forming an operational amplifier to output an output signal from a drain of the second NMOS transistor, the third NMOS transistor having a gate connected to the drain of the second NMOS transistor and a drain connected to the power source for outputting the output signal of the buffer amplifier from the source thereof.

The buffer amplifier is further provided with a fourth NMOS transistor having a gate connected to the power source and to sources of the first and second NMOS transistors for supplying regulated power to the first and second NMOS transistors. The source of the third NMOS transistor is also connected to the gate of the second NMOS transistor for forming a feedback loop which is preferably a negative feedback loop.

According to a further aspect of the invention, a sample holding circuit comprises a signal source for generating a series of timing pulses, a sample holding stage having an input for receipt of a voltage signal, the sample holding stage including a capacitor and a switching transistor responsive to each of the timing pulses for communicating the voltage signal to charge the capacitor, the sample holding stage having an output for producing a signal corresponding to the voltage stored in the capacitor, and voltage-follower circuits, one of which is connected to the input side of the sample/hold stage and the other of which is connected to the output side of the sample/hold circuits, each of the voltage-follower circuit being so designed as to have high impedance at the input side and low impedance at the output side and being operable to amplify an input signal at a gain substantially equal to unity without introducing any DC level shift.

In the preferred construction, at least one of the voltage-follower circuits comprises an operational amplifier having two inputs for receipt of two signals for amplifying a difference between the two signals, the operational amplifier having an output for producing a signal corresponding to the difference, the operational amplifier including a pair of transistors connected to provide voltage-follower operation, and a buffer circuit having an input connected to the output of the operational amplifier, the buffer circuit having an output coupled through a negative feedback path to one of the two inputs of the operational amplifier.

According to a still further aspect of the invention, a sample/hold circuit comprises a signal source for generating a series of timing pulses, a sample holding stage having an input for receipt of a voltage signal, the sample holding stage including a capacitor and a switching transistor responsive to each of the timing pulses for communicating the voltage signal to charge the capacitor, the sample holding stage having an output for producing a signal corresponding to the voltage stored in the capacitor, and voltage-follower circuits, one of which is connected to the input side of the sample holding stage and the other of which is connected to the output side of the sample holding circuit, each of the voltage-follower circuits including an amplifier and a buffer, each amplifier circuit being so designed as to have high impedance at the input side and low impedance at the output side and being operable to amplify an input signal at a gain substantially equal to unity without introducing any DC level shift.

According to a yet further aspect of the invention, an output circuit for a charge coupled device comprises a signal source for generating a series of timing pulses, a sample holding stage having an input for receipt of a voltage signal, the sample holding stage including a capacitor and a switching transistor responsive to each of the timing pulses for communicating the voltage signal to charge the capacitor, the sample holding stage having an output for producing a signal corresponding to the voltage stored in the capacitor, and at least one voltage-follower circuit associated with the sample holding stage, the voltage-follower circuit being operable to amplify an input signal at a gain substantially equal to unity without introducing a DC level shift, and including an operational amplifier and a buffer circuit, the operational amplifier having two inputs for receipt of two signals for amplifying a difference and having an output for producing a signal corresponding to the difference, the operational amplifier operating as a voltage-follower, and the buffer circuit having an input connected to the output of the operational amplifier, the buffer circuit having an output coupled through a negative feedback path to one of the two inputs of the operational amplifier.

BRIEF DESCRIPTION OF THE DRAWINGS

The present invention will be understood more fully from the detailed description given herebelow and from the accompanying drawings of the preferred embodiment of the invention, which, however, should not be taken to limit the invention to the specific embodiment but are for explanation and understanding only.

In the drawings:

FIG. 4 is a schematic and explanatory diagram showing the second embodiment of an output stage construction for a solid-state image pick-up device according to the invention;

FIG. 5 is a detailed circuit diagram of the second embodiment of the output stage construction for the solid-state image pick-up device of FIG. 4;

FIG. 6 is a schematic and explanatory diagram showing the third embodiment of an output stage construction for a solid-state image pick-up device according to the invention;

FIG. 7 is a detailed circuit diagram of the third embodiment of the output stage construction for the solid-state image pick up device of FIG. 6;

DESCRIPTION OF THE PREFERRED EMBODIMENT

Figure 1:
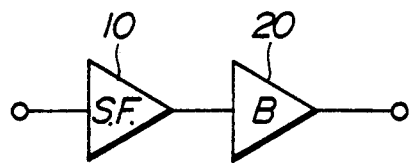
FIG. 1 is a schematic and explanatory diagram showing the first embodiment of an output stage construction for a solid-state image pick-up device according to the invention.
Figure 2:
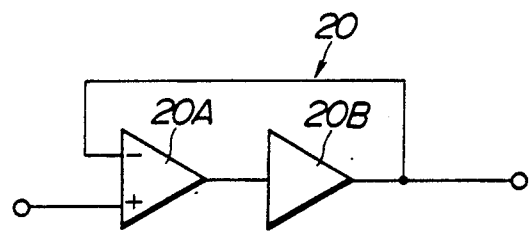
FIG. 2 is a schematic circuit diagram of a Burton circuit to be employed in the output stage circuit construction of FIG. 1.
Figure 3:
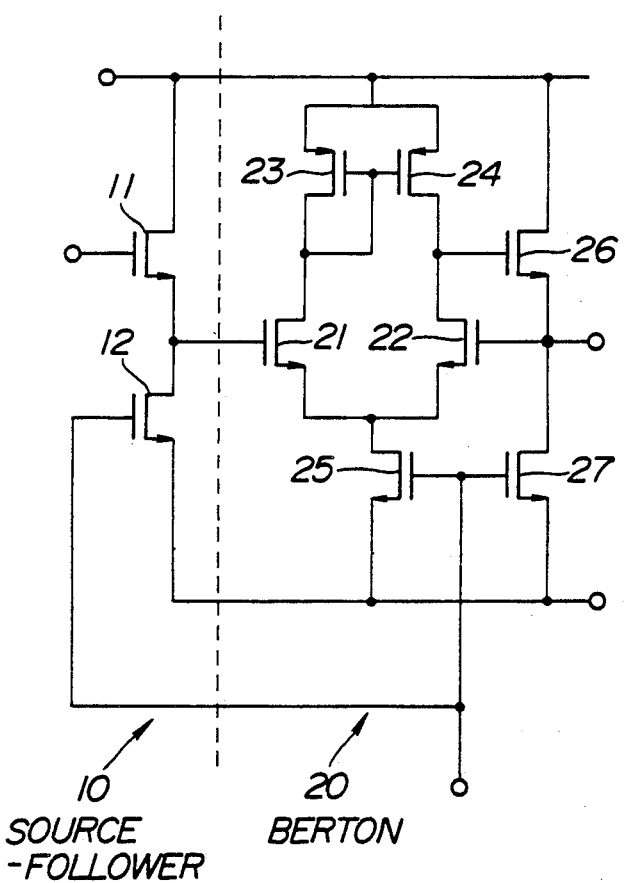
FIG. 3 is a detailed circuit diagram of the first embodiment of the output stage construction for the solid-state image pick-up device, of FIG. 1.

Referring now to the drawings, particularly to FIGS. 1 to 3, the first embodiment of an output stage construction, according to the present invention, is composed of a source follower circuit 10 which serves as an amplifier circuit and, a Burton circuit 20 as a buffer circuit. The source follower circuit 10 and the Burton circuit 20 are connected in series to form the output stage of the solid-state image pick-up device, i.e. a CCD. The source follower circuit 10 is connected to a floating gate of a CCD image pick-up device. The output section of the source follower circuit 10 is connected to the input section of the Burton circuit 20. The Burton circuit 20 is designed to output a constant DC level. The circuit layout of the source follower circuit 10 and the Burton circuit 20 as a series circuit makes it possible to suppress fluctuation of the DC level at the output.

FIG. 2 shows the Burton circuit 20. As seen from FIG. 2, the Burton circuit 20 comprises an operational amplifier 20A and a source follower 20B. The output of the source follower 20B is connected to the negative input terminal of the operational amplifier 20A to form a negative feedback circuit. With this construction, the Burton circuit 20 serves as a voltage follower having high input impedance and low output impedance. This suppresses fluctuation of the output DC level of the output stage of the CCD solid-state image pick-up device. With a fluctuation-suppressed output DC level, it becomes possible for a drive signal processing circuit to be connected to the next stage.

The circuit layout of FIGS. 1 and 2 can be modified by replacing the source follower circuit 10 and the source follower 20B with inverter circuits. Especially, in case that the source follower 20B is replaced with an inverter circuit, the transistor characteristics fluctuation due to difference of process condition will not significantly affect the circuit operation, since the inverter circuit is a per se feedback circuit. In this case, the feedback loop to be formed with the operational amplifier 20A will be a positive feedback loop.

FIG. 3 show practical circuit construction of the first embodiment of the output circuit of the solid-state image pick-up device, according to the invention. In the shown circuit construction, NMOS transistors 11 and 12 are arranged to form the source follower circuit 10. The NMOS transistors 11 and 12 are connected in series between the power source and the ground. The NMOS transistor 11 has a gate which forms an input section of the source follower circuit 10. Therefore, the gate of the NMOS transistor 11 is connected to the output section, such as a floating gate FG of the CCD solid-state image pick-up device in order to receive therefrom the input signal.

The NMOS transistor 11 also has a source which forms the output section of the source follower circuit 10. Therefore, the source of the NMOS transistor 11 is connected to the Burton circuit 20. As seen from FIG. 3, in the practical construction, the Burton circuit 20 has a NMOS transistor 21 having a gate connected to the source of the NMOS transistor 11. In this circuit layout, the NMOS transistor 12 serves as load.

The Burton circuit 20 serves as the buffer circuit as set forth above and has an arithmetic stage serving as the operational amplifier 20A, and the source follower stage 20B. The arithmetic stage 20A comprises a pair of NMOS transistors 21 and 22 forming differential amplifier, a pair of PMOS transistor 23 and 24 connected to the pair of NMOS transistors 21 and 22 in current mirror fashion, and a NMOS transistor 25 which serves for supplying constant voltage. The source follower stage 20B is composed of a pair of NMOS transistor 26 and 27 connected between the power source and the ground.

The NMOS transistors 21 and 22 are active as the differential amplifier as set forth above, for the input on the gate of the NMOS transistor 21 to output an output signal from the drain of the NMOS transistor 22. The drain of the NMOS transistor 22 is connected to the gate of the NMOS transistor 26. The NMOS transistor 26 is responsive to the input through the gate to output the output signal from the source. The source of the NMOS transistor 26 is also connected to the gate of the NMOS transistor 22 as a negative feedback input. This source of the NMOS transistor 26 and the gate of the NMOS transistor 22 form the negative feedback loop.

With the circuit construction set forth above, the operational amplifier stage constituted of the NMOS transistors 21 and 22, PMOS transistors 23 and 24 and NMOS transistor 25, is formed as a voltage follower circuit or as an impedance converter circuit. Therefore, the gain at this operational amplifier stage becomes 1.

Furthermore, because the operational amplifier serves as the voltage follower or the impedance converter, the output voltage becomes constant.

With this construction, the output impedance of the output circuit of the CCD solid-state image pick-up device can be successfully lowered since the Burton circuit 20 serving as a buffer amplifier can avoid the influence of the voltage fluctuation. Furthermore, as a the nature of the buffer amplifier employed in the shown circuit construction which allows to regulate the output voltage, greater level margin can be given for the CCD solid-state image pick up device. In other words, because a greater level margin can be given, lowering of the operation voltage level of the CCD solid-state image pick-up device becomes possible. Furthermore, since the output DC level can be held constant, circuit design with a fixed output voltage becomes possible to make designing easier. In addition, such circuit construction may give a wider signal dynamic range.

In the alternative of the shown first embodiment, the source follower stage in the Burton circuit 20 can be replaced with the inverter circuit. Furthermore, though the shown embodiment arranges the Burton circuit 20 at output side of the source follower circuit 10, it may be possible to arrange the same at input side of the latter.

FIGS. 4 and 5 show the second embodiment of the output stage construction of the CCD solid-state image pick-up device, according to the present invention.

In the shown circuit construction, an active low-pass filter 50 and a Burton circuit 60 are connected in series to the series circuit of the source follower circuit 10 and Burton circuit 20. Therefore, the output of the CCD solid-state image pick-up device is received by the source follower circuit 10. The Burton circuit 20 is responsive to the output signal from the source follower circuit 10 to output the constant DC level output signal. The active low-pass filter circuit 50 filters out the high-frequency component of the output signal from the Burton circuit 20 and feeds to the Burton circuit 60 which serves as another buffer amplifier.

Namely, in the shown embodiment, the buffer amplifiers 20 and 60 which hold the output DC level constant and have a gain of precisely 1, are provided for suppressing fluctuation in the input and output DC level at the active low pass filter circuit 50.

FIG. 5 shows the practical construction of the circuit in the second embodiment of the output stage for the CCD solid-state image pick-up device of FIG. 4. In the shown circuit construction of FIG. 5, the source follower circuit 10 and the Burton circuit 20 have substantially identical circuit constructions to that discussed with respect to the foregoing first embodiment. Therefore, the discussion of the circuit constructions and components in the source follower circuit 10 and Burton circuit 20 will be neglected and will be simply identified by the common reference numerals to that of the first embodiment, in order to avoid unnecessary redundancy in discussion and confusion in understanding.

The output of the Burton circuit 20, i.e. the source of the NMOS transistor 26, is connected to the active low-pass filter circuit 50. The active low-pass filter circuit 50 has the source of a MOS transistor 51a which serves as a resistor. The drain of the MOS transistor 51a is connected to the source of a MOS transistor 51b. The drain of the MOS transistor 51a is also connected to a capacitor 52a. The MOS transistor 51b and the capacitor 52a form a positive feedback loop. The drain of the MOS transistor 51b is connected to a capacitor 52b. As will be appreciated, these MOS transistors 51a and 51b and the capacitors 52a and 52b form a the time constant circuit for determining time constant characteristics of the active low-pass filter circuit 50.

The drain of the MOS transistor 51b is also connected to the gate of the NMOS transistor 53 of an operational amplifier circuit in the active low-pass filter circuit 50. The operational amplifier circuit comprises a pair of NMOS transistors 53 and 54 forming a differential amplifier, a pair of PMOS transistor 55 and 56 connected to the pair of NMOS transistors 53 and 54 in a current mirror fashion, and a NMOS transistor 57 which serves for supplying constant voltage. The source follower stage is composed of a pair of NMOS transistors 58 and 59 connected between the power source and the ground.

The NMOS transistors 53 and 54 are active as the differential amplifier as set forth above, on the input on the gate of the NMOS transistor 53 to output an output signal from the drain of the NMOS transistor 54. The drain of the NMOS transistor 54 is connected to the gate of the NMOS transistor 58. The NMOS transistor 58 is responsive to the input through the gate to output the output signal from the source. The source of the NMOS transistor 58 is also connected to the gate of the NMOS transistor 54 as negative feedback input. This source of the NMOS transistor 58 and the gate of the NMOS transistor 54 form the negative feedback loop.

With the circuit construction set forth above, the operational amplifier stage constituted of the NMOS transistors 53 and 54, PMOS transistors 55 and 56 and NMOS transistor 57, is formed as a voltage follower circuit or as an impedance converter circuit. Therefore, the gain at this operational amplifier stage becomes 1. Furthermore, because of the operational amplifier serves as the voltage follower or the impedance converter, the output voltage becomes constant.

As shown in FIG. 5, a practical circuit construction of the Burton circuit 60 has substantially the same circuit construction as that of the foregoing Burton circuit 20 discussed in the foregoing first embodiment of FIG. 3. A NMOS transistor 61 having a gate connected to the source of the NMOS transistor 58 of the active low-pass filter circuit 50.

Similarly to the Burton circuit 20, the Burton circuit 60 serves as the buffer circuit as set forth above and has an arithmetic stage serving as the operational amplifier, and the source follower stage. The arithmetic stage comprises a pair of NMOS transistors 61 and 62 forming a differential amplifier, a pair of PMOS transistor 63 and 64 connected to the pair of NMOS transistors 61 and 62 in a current mirror fashion, and a NMOS transistor 65 which serves for supplying constant voltage. The source follower stage is composed of a pair of NMOS transistor 66 and 67 connected between the power source and the ground.

The NMOS transistors 61 and 62 are active as the differential amplifier as set forth above, on the input on the gate of the NMOS transistor 61 to output an output signal from the drain of the NMOS transistor 62. The drain of the NMOS transistor 62 is connected to the gate of the NMOS transistor 66. The NMOS transistor 66 is responsive to the input through the gate to output the output signal from the source. The source of the NMOS transistor 66 is also connected to the gate of the NMOS transistor 62 as negative feedback input. This source of the NMOS transistor 66 and the gate of the NMOS transistor 62 forms the negative feedback loop.

With the circuit construction set forth above, the operational amplifier stage constituted of the NMOS transistors 61 and 62, PMOS transistors 63 and 64 and NMOS transistor 65, is formed as a voltage follower circuit or as an impedance converter circuit. Therefore, the gain at this operational amplifier stage becomes 1. Furthermore, because of the operational amplifier serves as the voltage follower or the impedance converter, the output voltage becomes constant.

With this construction, the output impedance of the output circuit of the CCD solid-state image pick-up device can be successfully lowered since the Burton circuit 60 serving as a buffer amplifier can avoid the influence of the voltage fluctuation. Furthermore, as the nature of the buffer amplifier employed in the shown circuit construction which allows to regulate the output voltage, a greater level margin can be given for the CCD solid-state image pick-up device. In other words, because the greater level margin can be given, lowering of the operation voltage level of the CCD solid-state image pick-up device becomes possible. Furthermore, since the output DC level can be held constant, circuit design with a fixed output voltage becomes possible to make designing easier. In addition, such circuit construction may give a wider signal dynamic range.

FIGS. 6 and 7 show the third embodiment of the output stage of the CCD solid-state image pick-up device according to the invention. In this embodiment, a sample/hold circuit 30 is interposed between the Burton circuits 20 and 40. Namely, the source follower circuit 10, the Burton circuit 20, the sample/hold circuit 30, Burton circuit 40, the active low-pass filter circuit 50 and the Burton circuit 60 form a series circuit serving as the output state of the CCD solid-state image pick-up device, as shown in FIG. 6.

FIG. 7 shows the detailed circuit construction of the third embodiment of the circuit construction of the output stage of the CCD solid state image pick-up device, according to the invention. The shown circuit construction is substantially the same as that of the foregoing second embodiment except for the sample hold circuit 30. Therefore, the following disclosure will be concentrated to the sample/hold circuit 30 and the associated circuit components in the already disclosed circuits in order to avoid unnecessary redundancy in recitation and to avoid possibility of confusion.

The sample/hold circuit 30 comprises a switching transistor 31 and a sample/holding capacitor 32. The switching transistor 31 has a gate connected to a sample/hold signal source to receive a sample/hold pulse. The source of the switching transistor 31 is connected to the output of the Burton circuit 20 to receive therefrom the output signal. The switching transistor 31 is turned ON and OFF by the sample/hold pulse for controlling charge and discharge of the capacitor 32.

In this case, the Burton circuit 20 provided at an input side of the switching transistor 31 of the sample/hold circuit 30 supplies a constant DC level of output signal to the sample/hold circuit. On the other hand, the Burton circuit 40 provided at the output side of the sample/hold circuit 30 regulates the output DC level of the output signal of the sample/hold circuit. Therefore, the operation of the active low-pass filter circuit 50 becomes stable.

Figure 8:
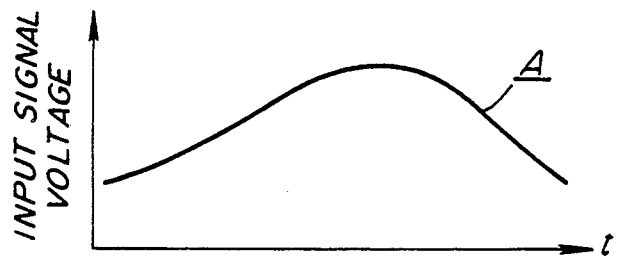
FIG. 8 is a diagram of an analog signal coupled to the input terminal of the sample holding circuit.
Figure 9:
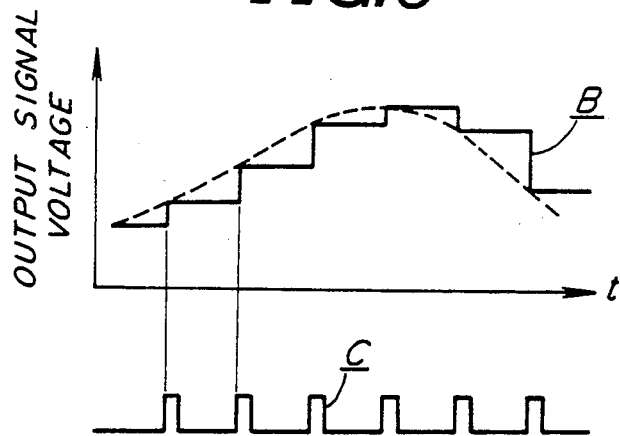
FIG. 9 is a diagram of the signal generated at the output terminal of the sample holding circuit.

In the shown construction of the foregoing third embodiment of the sample/hold circuit 30 connected with the Burton circuit 20 and 40, the operation is as follows. It is now assumed that an analog signal, as indicated by the waveform A of FIG. 8, is applied to the input terminal of the sample/hold circuit 30. The analog signal is applied to the Burton circuit 20 serving as the voltage-follower circuit, which amplifies the analog signal at a gain of 1 and applies the amplified analog signal to the sample holding stage. Since the Burton circuit 40 as the voltage-follower circuit introduces no DC level shift, the amplified signal has no DC level fluctuation. The sample/hold stage samples and holds values for the analog signal at an appropriate sampling timing controlled by the sample hold pulse applied to the gate of the switching transistor 31. The sample hold pulse is indicated by the waveform C of FIG. 9. The sampled signal, which is indicated by the waveform B of FIG. 9, is applied from the sample holding stage to the Burton circuit 40. The Burton circuit 40 amplifies the sampled signal at a gain of 1. Since the Burton circuit 20 introduces no DC level shift, the output signal has no DC voltage fluctuation. The output signal is applied from the sample/hold circuit output terminal to the following stage.

Figure 10:
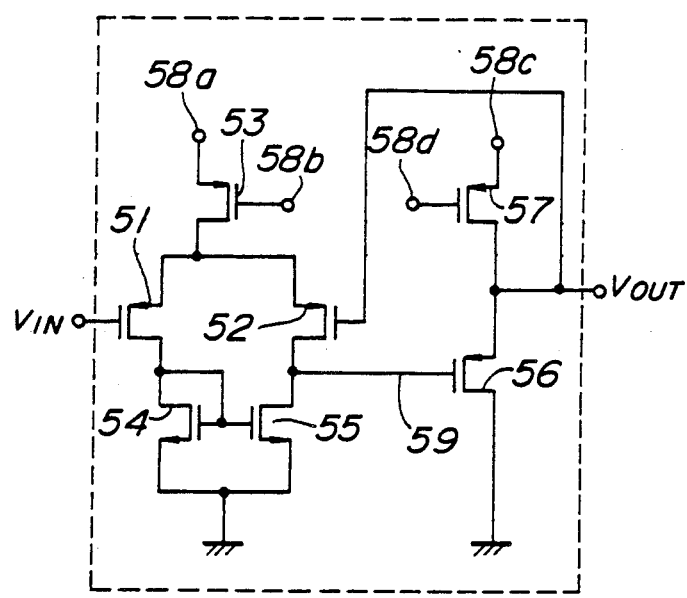
FIG. 10 is a circuit diagram showing another form of the amplifier circuit.

FIG. 10 shows an alternative embodiment of the Burton circuit which can be employed in the foregoing embodiments of the output stage of the CCD solid-state image pick-up device according to the invention. The operational amplifier includes a pair of PMOS transistors 71 and 72 connected in a common source fashion. Each of the PMOS transistors 71 and 72 has a source connected to a constant voltage source 78a through the source-drain circuit of a transistor 73 which has a gate electrode connected to a constant voltage source 78b. The transistor 73 serves as a constant current source. The transistor 71 has a gate electrode connected to an input terminal Vin. The PMOS transistor pair is connected to ground through an active load which includes a pair of transistors 74 and 75 each having an source connected to ground and a gate connected to the drain of the transistor 71. The transistor 74 has a drain connected to the drain of the transistor 71. The transistor 75 has a drain connected to the drain of the transistor 72. The junction between the transistors 75 and 72 forms an operational amplifier output terminal.

The buffer circuit includes a pair of PMOS transistors 76 and 77. The transistor 76 has a gate connected to the operational amplifier output terminal, that is, the junction between the transistors 75 and 72. The transistor 76 also has a drain connected to ground and a source connected to the drain of the transistor 77. The transistor 76 has a gate electrode connected to a constant voltage source 78d and a source connected to a constant voltage source 78c. The junction between the transistors 76 and 77 is connected to an output terminal Vout and also through a negative feedback path to the gate electrode of the transistor 72.

It is apparent from the foregoing that there is provided, in accordance with the invention, a sample holding circuit which can operate without introducing any DC level shift. This feature is effective to simplify circuit design. The sample holding circuit can be arranged to have a wider dynamic signal range and a wider circuit margin so that the circuit can operate on a low-voltage power source. In addition, a plurality of such sample holding circuits can be connected to form a multistage sample holding circuit which can operate without any voltage shift associated problems.

While two amplifier circuits have been shown and described as being connected on the input and output sides of a sample holding stage, it will be appreciated that the sample holding circuit may include at least one amplifier circuit connected to the input and/or output side of the sample holding stage.

Though the present invention has been disclosed in terms of the preferred embodiment in order to facilitate better understanding of the invention, it should be appreciated that the invention can be embodied in various ways without departing from the principle of the invention. Therefore, the invention should be understood to include all possible embodiments and modifications to the shown embodiments which can be embodied without departing from the principle of the invention set out in the appended claims.

What is claimed is:

1. An output circuit for a solid-state image pick-up device comprising:

an amplifier circuit connected to said solid-state image pick-up device for amplifying an output signal of said solid-state image pick-up device, said amplifier circuit including a NMOS transistor having a gate connected to an output of said solid-state image pick-up device, and a drain connected to a power source, said NMOS transistor being switched between a conductive state and a non-conductive state by said output signal of said solid-state image pick-up device applied to said gate for outputting an output signal from the source of said NMOS transistor; and a buffer amplifier circuit in a voltage follower configuration connected to at least one of an input side and an output side of said amplifier circuit, said buffer amplifier circuit having a gain of substantially 1 and outputting a constant DC level output signal, said buffer amplifier including first, second and third NMOS transistors and first and second PMOS transistors, said first NMOS transistor having a gate connected to said source of said NMOS transistor of said amplifier circuit, said first, second and third NMOS transistors and said first and second PMOS transistors cooperating with each other for forming an operational amplifier to output an output signal from a drain of said second NMOS transistor, said third NMOS transistor having a gate connected to said drain of said second NMOS transistor and a drain connected to the power source for outputting the output signal of said buffer amplifier from the source thereof.

2. An output circuit for a solid-state image pick-up device as set forth in claim 1, wherein said buffer amplifier is further provided with a fourth NMOS transistor having a gate connected to a power source and to sources of said first and second NMOS transistors for supplying regulated power to said first and second NMOS transistor.

3. An output circuit for a solid-state image pick-up device as set forth in claim 1, wherein the source of the third NMOS transistor is also connected to the gate of said second NMOS transistor for forming a feedback loop.

4. An output circuit for a solid-state image pick-up device as set forth in claim 3, wherein said feedback loop is a negative feedback loop.

5. An output circuit for a solid state image pick-up device as set forth in claim 2, wherein the source of the third NMOS transistor is also connected to the gate of said second NMOS transistor for forming a feedback loop.

6. An output circuit for a solid-state image pick-up device as set forth in claim 5, wherein said feedback loop is a negative feedback loop.

7. An output circuit for a solid-state image pick-up device as set forth in claim 1, which further comprises an active low-pass filter circuit forming a series circuit with said amplifier, which active low-pass filter includes first and second MOS transistors and first and second capacitors, said first MOS transistor having a source connected to an output of said buffer amplifier circuit and a gate connected to a power source for controlling charging and discharging of said first capacitor, said second MOS transistor having a source connected to a drain of said first MOS transistor and a gate connected to the power source for controlling charging and discharging of said second capacitor, and said first and second MOS transistors and said first and second capacitors forming a time constant circuit.

8. An output circuit for a solid-state image pick-up device as set forth in claim 7, which further comprises an active low-pass filter including a voltage follower circuit connected to at least one of an input side and an output side of said amplifier circuit, said voltage follower circuit having a gain of substantially 1 and outputting a constant DC level output signal, said buffer amplifier including fifth, sixth and seventh NMOS transistors and third and fourth PMOS transistors, said fifth NMOS transistor having a gate connected to receive an output of said amplifier circuit, said fifth, sixth and seventh NMOS transistors and said third and fourth PMOS transistors cooperating with each other for forming an operational amplifier to output an output signal from a drain of said sixth NMOS transistor, said seventh NMOS transistor having a gate connected to said drain of said sixth NMOS transistor and a drain connected to the power source for outputting the output signal of said buffer amplifier from the source thereof.

9. An output circuit for a solid-state image pick-up device as set forth in claim 8, wherein said voltage follower circuit is further provided with an eighth NMOS transistor having a gate connected to the power source and to sources of said fifth and sixth NMOS transistors for supplying regulated power to said fifth and sixth NMOS transistors.

10. An output circuit for a solid-state image pick-up device as set forth in claim 9, wherein the source of seventh NMOS transistor is also connected to the gate of said sixth NMOS transistor for forming a feedback loop.

11. An output circuit for a solid-state image pick-up device as set forth in claim 10, wherein said feedback loop is a negative feedback loop.

12. An output circuit for a solid-state image pick-up device as set forth in claim 8 which further comprises an active low-pass filter including a voltage follower circuit connected to at least one of an input side and an output side of said amplifier circuit, said voltage follower circuit having a gain of substantially 1 and outputting a constant DC level output signal, said buffer amplifier including fifth, sixth and seventh NMOS transistors and third and fourth PMOS transistors, said fifth NMOS transistor having a gate connected to a drain of said second MOS transistor, said fifth, sixth and seventh NMOS transistors and said third and fourth PMOS transistors cooperating with each other for forming an operational amplifier to output an output signal from a drain of said sixth NMOS transistor, said seventh NMOS transistor having a gate connected to said drain of said sixth NMOS transistor and a drain connected to a power source for outputting the output signal of said buffer amplifier from the source thereof.

13. An output circuit for a solid-state image pick-up device as set forth in claim 12, wherein said voltage follower circuit is further provided with a eighth NMOS transistor having a gate connected to the power source and to sources of said fifth and sixth NMOS transistors for supplying regulated power to said fifth and sixth NMOS transistors.

14. An output circuit for a solid-state image pick-up device as set forth in claim 13, wherein the source of the seventh NMOS transistor is also connected to the gate of said sixth NMOS transistor for forming a feedback loop.

15. An output circuit for a solid-state image pick up device as set forth in claim 14, wherein said feedback loop is a negative feedback loop.

16. An output circuit for a solid-state image pick-up device as set forth in claim 1, which further comprises a sample/hold circuit including a switching transistor and a sample/hold capacitor, said switching transistor having a source connected to an output of said buffer amplifier and a gate connected to a sample/hold pulse source.

17. An output circuit for a solid-state image pick-up device as set forth in claim 16, wherein the drain of said switching transistor is connected to a voltage follower circuit, said voltage follower circuit having a gain of substantially 1 and outputting a constant DC level output signal, said buffer amplifier including fifth, sixth and seventh NMOS transistors and third and fourth PMOS transistors, said fifth NMOS transistor having a gate connected to receive an output of said amplifier circuit, said fifth, sixth and seventh NMOS transistors and said third and fourth PMOS transistors cooperating with each other for forming an operational amplifier to output an output signal from a drain of said sixth NMOS transistor, said seventh NMOS transistor having a gate connected to said drain of said sixth NMOS transistor and a drain connected to a power source for outputting the output signal of said buffer amplifier from the source thereof.

18. An output circuit for a solid-state image pick-up device as set forth in claim 17, wherein said voltage follower circuit is further provided with an eighth NMOS transistor having a gate connected to the power source and to sources of said fifth and sixth NMOS transistors for supplying regulated power to said fifth and sixth NMOS transistors.

19. An output circuit for a solid-state image pick-up device as set forth in claim 18, wherein the source of seventh NMOS transistor is also connected to the gate of said sixth NMOS transistor for forming a feedback loop.

20. An output circuit for a solid-state image pick-up device as set forth in claim 19, wherein said feedback loop is a negative feedback loop.

21. An output circuit for a solid-state image pick-up device as set forth in claim 20, which further comprises an active low-pass filter circuit forming a series circuit with said amplifier and said sample/hold circuit, which active low-pass filter includes first and second MOS transistors and first and second capacitors, said first MOS transistors having a source connected to output of said buffer amplifier circuit and a gate connected to the power source for controlling charging and discharging of said first capacitor, said second MOS transistor having a source connected to a drain of said first MOS transistor and a gate connected to the power source for controlling charging and discharging of said second capacitor, and said first and second MOS transistor and said first and second capacitors forming a time constant circuit.

22. An output circuit for a solid-state image pick-up device as set forth in claim 21, wherein said active low-pass filter further includes a voltage follower circuit connected to at least one of a input side and an output side of said amplifier circuit, said voltage follower circuit having a gain of substantially 1 and outputting a constant DC level output signal, said buffer amplifier including ninth, tenth and eleventh NMOS transistors and fifth and sixth PMOS transistors, said ninth NMOS transistor having a gate connected to receive an output of said amplifier circuit, said ninth, tenth and eleventh NMOS transistors and said fifth and sixth PMOS transistors being cooperative to each other for forming an operational amplifier to output an output signal from drain of said tenth NMOS transistor, said eleventh NMOS transistor having a gate connected to said drain of said tenth NMOS transistor and a drain connected to the power source for outputting the output signal of said buffer amplifier from the source thereof.

23. An output circuit for a solid-state image pick-up device as set forth in claim 22 wherein said voltage follower circuit is further provided with a twelfth NMOS transistor having a gate connected to the power source and to sources of said ninth and tenth NMOS transistors for applying regulated power to said ninth and tenth NMOS transistors.

24. An output circuit for a solid-state image pick-up device as set forth in claim 23, wherein the source of the eleventh NMOS transistor is also connected to the gate of said tenth NMOS transistor for forming a feedback loop.

25. An output circuit for a solid-state image pick-up device as set forth in claim 24, wherein said feedback loop is a negative feedback loop.

26. An output circuit for a solid-state image pick-up device as set forth in claim 21, wherein the output of said an active low-pass filter is connected to a buffer amplifier circuit having a gain of substantially 1 and outputting a constant DC level output signal, said buffer amplifier including thirteenth, fourteenth and fifteenth NMOS transistors and seventh and eighth PMOS transistors, said thirteenth NMOS transistor having a gate connected to the source of said eleventh NMOS transistor of said active low-pass filter, said thirteenth, fourteenth and fifteenth NMOS transistors and said seventh and eighth PMOS transistors cooperating with each other for forming an operational amplifier to output an output signal from a drain of said tenth NMOS transistor, said fifteenth NMOS transistor having a gate connected to said drain of said fourteenth NMOS transistor and a drain connected to the power source for outputting the output signal of said buffer amplifier from the source thereof.

27. An output circuit for a solid-state image pick-up device as set forth in claim 26, wherein said buffer amplifier circuit is further provided with a sixteenth NMOS transistor having a gate connected to the power source and to sources of said ninth and fourteenth NMOS transistors for supplying regulated power to said thirteenth and fourteenth NMOS transistors.

28. An output circuit for a solid-state image pick-up device as set forth in claim 27, wherein the source of the fifteenth NMOS transistor is also connected to the gate of said fourteenth NMOS transistor for forming a feedback loop.

29. An output circuit for a solid-state image pick-up device as set forth in claim 28, wherein said feedback loop is a negative feedback loop.

30. An output circuit for a solid-state image pick-up device as set forth in claim 4, which is provided with first, second and third buffer amplifiers, an input of said first buffer amplifier circuit being connected to said amplifier circuit and an output thereof being connected to said sample/hold circuit, an input of said second buffer amplifier circuit being connected to an output of said sample/hold circuit and an output thereof being connected to said filter circuit, and an input of said third buffer amplifier circuit being connected to an output of said filter circuit.

* * * * *